(12) United States Patent
Lee

(10) Patent No.: US 7,091,803 B2
(45) Date of Patent: Aug. 15, 2006

(54) SIGNAL TRANSMISSION STRUCTURE

(75) Inventor: Sheng-Yuan Lee, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 125 days.

(21) Appl. No.: 10/942,611

(22) Filed: Sep. 15, 2004

(65) Prior Publication Data

US 2005/0104692 A1    May 19, 2005

(30) Foreign Application Priority Data

Nov. 13, 2003    (TW) .............................. 92131758 A

(51) Int. Cl.
*H01P 3/08* (2006.01)

(52) U.S. Cl. .................. 333/246; 333/33; 361/794; 174/261

(58) Field of Classification Search .................. 333/33, 333/25, 246; 361/794, 748, 803; 174/261, 174/262
See application file for complete search history.

(56) References Cited

U.S. PATENT DOCUMENTS 5,272,600 A * 12/1993 Carey .......................... 361/792

* cited by examiner

*Primary Examiner*—Stephen E. Jones
(74) *Attorney, Agent, or Firm*—J.C. Patents

(57) ABSTRACT

A signal transmission structure is disclosed. The signal transmission structure is adapted for a circuit substrate, including at least a signal line, a plating bar and a reference plane. The plating bar is disposed on a side of the reference plane and connected to the signal line. In addition, the plating bar is disposed on the side of the reference plane, and the reference plane has a non-reference area corresponding to the plating bar. The signal transmission structure can reduce the impedance mismatch at the conjunction of the signal line and the plating bar, and the resonant frequency of the plating bar can be improved as to generate a desired transmission quality of the signal.

12 Claims, 3 Drawing Sheets

SIGNAL TRANSMISSION STRUCTURE

CROSS-REFERENCE TO RELATED APPLICATION

This application claims the priority benefit of Taiwan application serial no. 92131758, filed Nov. 13, 2003.

BACKGROUND OF THE INVENTION

1. Field of the Invention

The present invention relates to a signal transmission structure, and more particularly to a signal transmission structure adapted to reduce impedance mismatch on signal lines resulting from the plating bar and to enhance the resonant frequency thereof.

2. Description of the Related Art

In circuit substrates, signal lines applied thereon to couple two ports or components and used for transmitting signals, especially high frequency or speed, signals should be kept at a constant width for maintaining characteristic impedance thereof. Moreover, the impedance mismatch of the signal lines for transmitting the signals should be improved to reduce the reflection of signals stemming therefrom. Therefore, to reduce the insertion loss of the signal transmission and to enhance the return loss of the signals can improve the transmission quality thereof.

In a prior art circuit substrate, such as a chip carrier for chip package, after the formations of the transmission circuit and the solder mask layer, an anti-oxidation layer, such as a Ni/Au layer, is electroplated on bonding pads of the transmission circuit for avoiding the oxidation of Cu therein. Therefore, the adhesion of the bonding pads is enhanced. For electroplating the anti-oxidation layer, the bonding pads of the transmission circuit are coupled to an external power via a plating bar.

As to wire bonding technology, die bonding, wire bonding, molding and trimming processes are sequentially performed after the formation of the anti-oxidation layer. During the trimming process, the plating bar is trimmed thereby for forming a plurality of chip packages. It should be noted that the plating bar cannot be completely removed during the trimming and resides thereon.

FIG. 1 is a schematic stereo configuration of a prior art signal transmission structure. The signal transmission structure 100 is adapted for a circuit substrate, such as a chip carrier. The signal transmission structure 100 comprises a signal line 110, a plating bar 120, a ground plane 130 and a power plane 140. The ground plane 130 is over the power plane 140. The signal line 110 is composed of a first signal line 110a, a via 110b and a second signal line 110c. The first signal line 110a is disposed on the ground plane 130, and the second signal line 110c is disposed under the power plane 140. The first signal line 110a, the ground plane 130, the power plane 140 and the second signal line 110c can be sequentially formed on each layer of the four-layer patterned circuit substrate. In addition, the via 110b, through the ground plane 130 and the power plane 140, electrically connects the first signal line 110a and the second signal line 110b.

Referring to FIG. 1, the plating bar 120 and the first signal line 110a are on the ground surface 130. One end of the plating bar 120 connects with the first signal line 110a which results in an induced capacitance between the plating bar 120 and the ground plane 130. Therefore, the characteristic impedance at the conjunction of the signal line 110 and the plating bar 120 varies. Because of the impedance mismatch of the signal line 110 resulting from the plating bar 120, a big insertion loss or a small return loss occurs which results in the incompletion of the transmission of signals from one end to the other of the signal line 110.

To resolve the issue of impedance mismatch, the prior art reduces the width of the plating bar for enhancing the impedance thereof. Although the issue can be resolved by the approach, it still cannot efficiently reduce the effective permittivity of the plating bar and enhance the resonant frequency thereof for the high frequency or speed signal transmission structures. Therefore, under this circumstance, the transmission quality of high frequency signals cannot be substantially improved.

SUMMARY OF THE INVENTION

Therefore, the present invention provides a signal transmission structure adapted to reduce impendence mismatch of the signal line resulting from the plating bar in order to improve the transmission quality of the signals.

The present invention discloses a signal transmission structure adapted for a circuit substrate, which comprises a signal line, a plating bar and a reference plane. The signal line is disposed on a side of the reference plane, connected to the plating bar. In addition, the plating bar is disposed on a side of the reference plane. The reference plane has a non-reference region corresponding to the plating bar.

According to the embodiment of the present invention, the signal line and the plating bar are, for example, on the same side of the reference plane. In addition, the signal transmission structure further comprises, for example, a via through the reference plane. Alternatively, the signal line and the plating bar are, for example, not on the same side of the reference plane and connected to each other through the via.

According to the embodiment of the present invention, the non-reference region locally or completely corresponds to the plating bar. When the non-reference region locally corresponds to the plating bar, the non-reference region further corresponds to the conjunction of the plating bar and the signal line.

According to the embodiment of the present invention, the reference plane further comprises at least one opening, and the non-reference region is composed of the opening.

According to the embodiment of the present invention, the reference plane can be, for example, a ground plane or a power plane.

Accordingly, the signal transmission structure of the present invention has a non-reference region, such as an opening, corresponding to the plating bar for reducing the induced capacitance of the reference plane and the plating bar so as to reduce the impendence mismatch of the plating bar and the signal line and to enhance the resonant frequency of the plating bar. A desired transmission quality of the signals is obtained. It should be noted, the non-reference region of the signal transmission structure of the present invention can be a different shape according to the relative locations of the non-reference region and the plating bar.

In order to make the aforementioned and other objects, features and advantages of the present invention understandable, a preferred embodiment accompanied with figures is described in detail below.

DESCRIPTION OF SOME EMBODIMENTS

Figure 1:
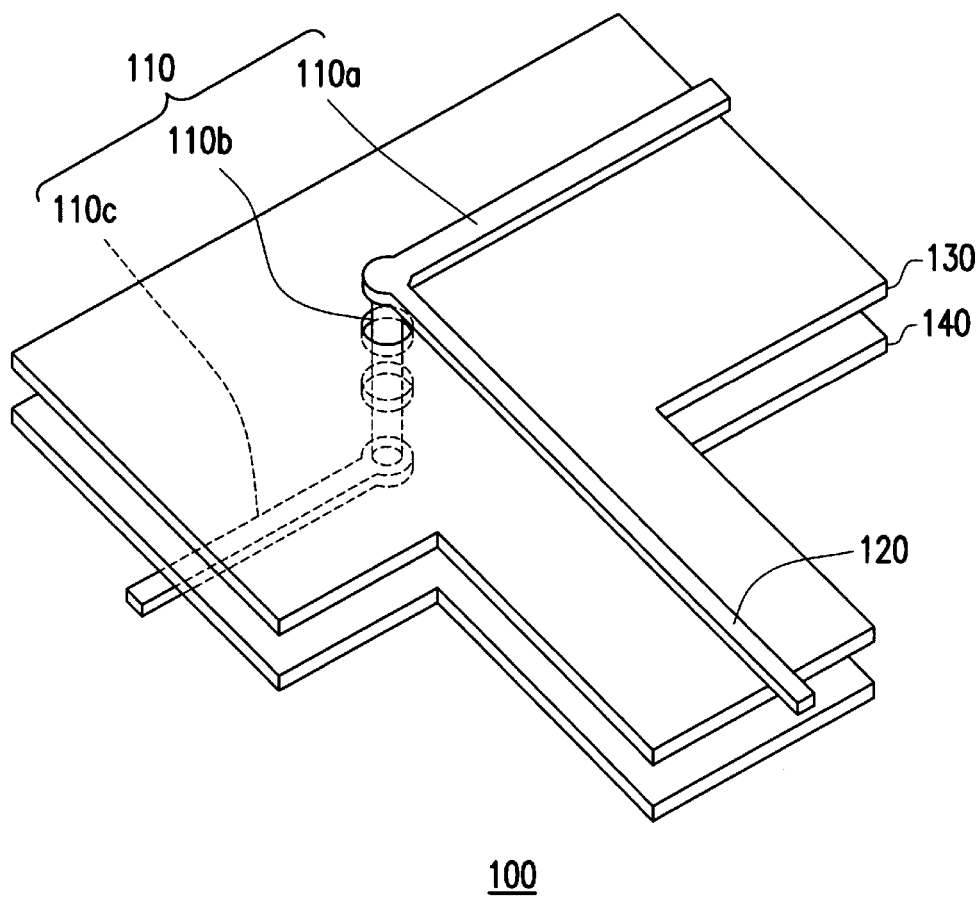
FIG. 1 is a schematic stereo configuration of a prior art signal transmission structure.
Figure 2:
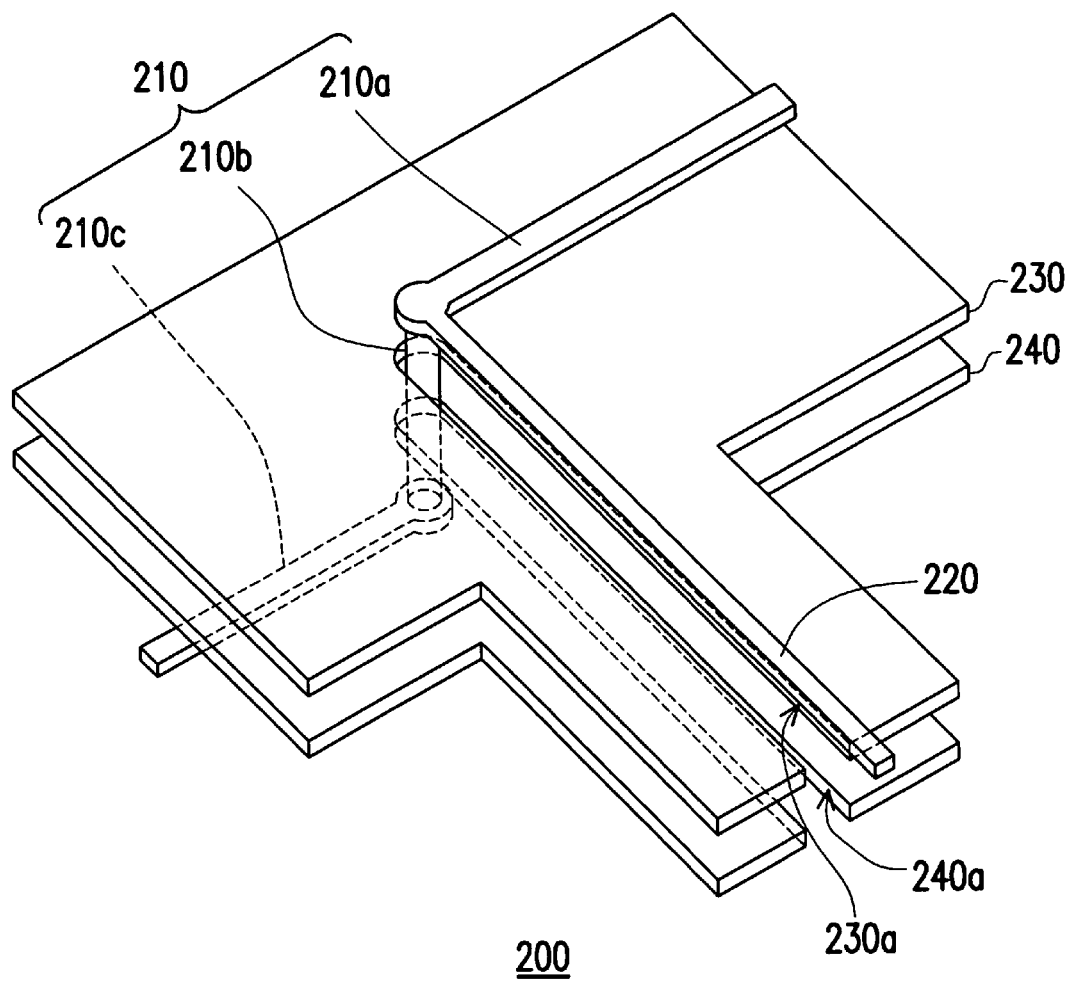
FIG. 2 is a schematic stereo configuration showing a signal transmission structure according to a preferred embodiment of the present invention.

FIG. 2 is a schematic stereo configuration showing a signal transmission structure according to a preferred embodiment of the present invention. The signal transmission structure 200 is adapted for a multilayer patterned circuit substrate, such as a four-layer patterned circuit substrate. The signal transmission structure 200 comprises a signal line 210, a plating bar 220, a ground plane 230 and a power plane 240. The ground plane 230 is disposed over the power plane 240 and parallel thereto. The signal line 210 is composed of a first signal line 210*a*, a via 210*b* and a second signal line 210*c*. The first signal line 210*a* is disposed on the ground plane 230, and the second signal line 210*c* is disposed under the power plane 240. The first signal line 210*a*, the ground plane 230, the power plane 240 and the second signal line 210*c* can be sequentially formed on each layer of the four-layer patterned circuit substrate. In addition, the via 210*b*, through the ground plane 230 and the power plane 240, electrically connects the first signal line 210*a* and the second signal line 210*b*. The plating bar 220 and the first signal line 210*a* are on the same surface. In the embodiment, an end of the plating bar is connected with the conjunction of the first signal line 210*a* and the second signal line 210*b*.

Referring to FIG. 2, in order to avoid the impendence mismatch of the signal line 210 resulting from the induced capacitance of the plating bar 220, the embodiment forms a first non-reference region 230*a* and a second non-reference region 240*a* on the ground plane 230 and the power plane 240, respectively. The first non-reference region 230*a* is composed of an opening on the ground plane 230. The second non-reference region 240*a* is composed of an opening on the power plane 240. The first non-reference region 230*a* and the second non-reference region 240*a* can further correspond to the conjunction of the plating bar 220 and the via 210*b*, i.e., the conjunction of the plating bar 220 and the first signal line 210*a*. Therefore, the induced capacitance of the plating bar 220 and the ground plane 230 or the power plane 240 is substantially reduced by forming the first non-reference region 230*a* or the second non-reference region 240*a*. The characteristic impendence of the plating bar 220 is enhanced and the impendence mismatch of the signal line 210 resulting from the plating bar 220 is reduced. The effective permittivity of the plating bar 220 can also be reduced as to enhance the resonant frequency thereof by the formation of the first non-reference region 230*a* and the second non-reference region 240*a*. Therefore, the signal transmission structure 200 of the present invention can improve the transmission quality of signals.

Except for the signal transmission structure shown in FIG. 2, the signal line and plating bar can be on the same, or different, sides of the reference plane. The structure thereof is similar to that of the embodiment shown in FIG. 2, and therefore, detailed descriptions thereof are not repeated. In addition, even though the non-reference region of the signal transmission structure is shown in FIG. 2 to have a rectangular opening, however the non-reference region can also be in the form of a plurality of openings. Moreover, the relative locations of the plating bar and the non-reference region can vary differently according to the requirements.

Figure 3:
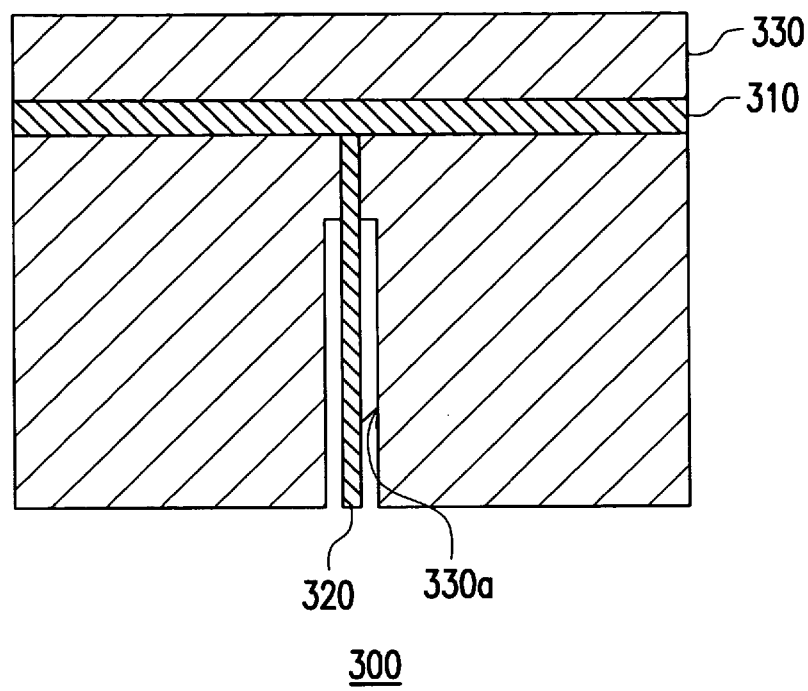
FIGS. 3 and 4 are top views showing signal transmission structures having different locations or structures of the non-reference region according to a preferred embodiment of the present invention.
Figure 4:
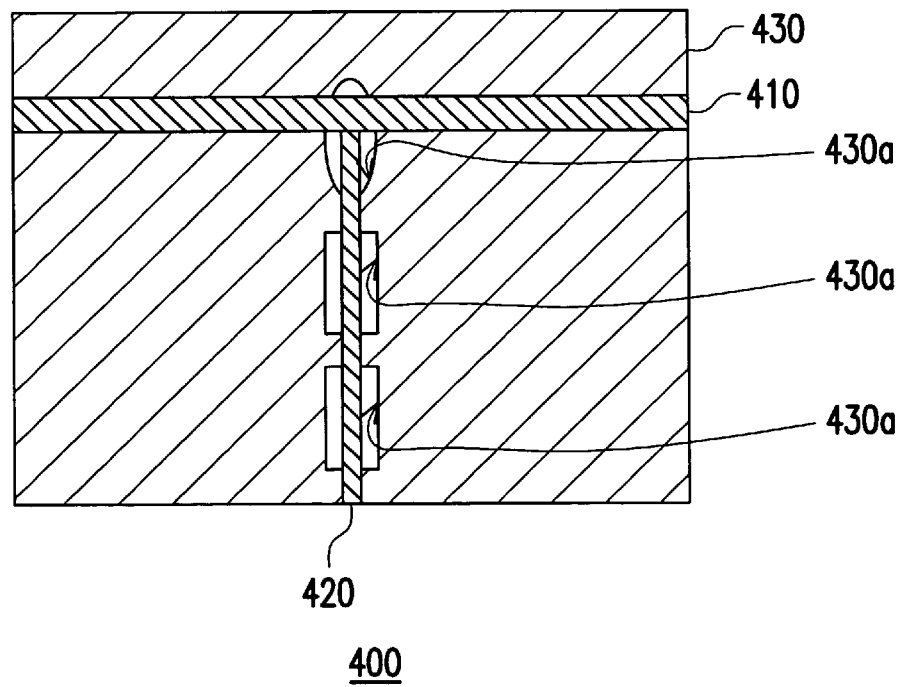

FIGS. 3 and 4 are top views showing signal transmission structures having different locations or structures of the non-reference region according to a preferred embodiment of the present invention. For illustration purpose, a single reference plane, such as a ground plane or a power plane, is shown therein. The signal line connects with the plating bar, both of them are on the reference plane, and the non-reference region is on the reference plane.

In the signal transmission structure 300 shown in FIG. 3, the non-reference region 330*a* is, for example, composed of an opening. The non-reference region 330*a* corresponds to a bottom portion of the plating bar 320, and may not correspond to the conjunction of the plating bar 320 and the signal line 310. In the signal transmission structure 400 shown in FIG. 4, the non-reference region 430*a* is composed of the same, or different, shape of openings. The openings of the non-reference region 430*a* can be disposed under the plating bar 420 and the conjunction of the plating bar 420 and the signal line 410.

In the signal transmission structure of the present invention, the relative locations of the non-reference region and the plating bar can be adjustable so that the plating bar corresponds locally or completely to the non-reference region. In addition, when the circuit substrate has multi-patterned conductive layers, the non-reference region can be formed on each reference plane corresponding to the plating bar.

Accordingly, the signal transmission structure of the present invention has a non-reference region corresponding to the plating bar for reducing the induced capacitance of the reference plane and the plating bar as to reduce the impendence mismatch of the plating bar and the signal line. Moreover, the effective permittivity of the plating bar can also be reduced as to enhance the resonant frequency thereof. Therefore, compared with the prior art signal transmission structure, the signal transmission structure of the present invention can improve the transmission quality of high frequency signals.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A signal transmission structure, adapted for a circuit substrate, comprising:

a reference plane, having a non-reference region;

a signal line, disposed on a side of the reference plane;

a plating bar, disposed on a side of the reference plane, wherein the plating bar is coupled to the signal line and the non-reference region corresponds to the plating bar; and a via through the reference plane, wherein the signal line and the plating bar on different sides are connected through the via.

2. The signal transmission structure of claim 1, wherein the signal line and the plating bar are on the same side of the reference plane.

3. The signal transmission structure of claim 1, wherein the non-reference region completely corresponds to the plating bar.

4. The signal transmission structure of claim 1, wherein the reference plane has at least one opening, and the non-reference region is composed of the opening.

5. The signal transmission structure of claim 1, wherein the reference plane is a power plane or a ground plane.

6. The signal transmission structure of claim 1, wherein the non-reference region locally corresponds to the plating bar.

7. The signal transmission structure of claim 6, wherein the non-reference region locally corresponds to a conjunction of the plating bar and the signal line.

8. The signal transmission structure of claim 6, wherein the non-reference region does not correspond to a conjunction of the plating bar and the signal line.

9. A signal transmission structure, adapted for a circuit substrate, comprising:

at least one signal line;

a plating bar, wherein an end of the plating bar is connected to the signal line;

a ground plane disposed on a side same as that of the signal line and the plating bar, the ground plane having an opening corresponding to the plating bar; and a via passing through the ground plane, wherein the via connects with the signal line.

10. The signal transmission structure of claim 9, wherein a length of the opening is equal to a length of the plating bar.

11. The signal transmission structure of claim 9, wherein a length of the opening is shorter than that of the plating bar.

12. The signal transmission structure of claim 9, wherein the opening surrounds the via.

* * * * *